United States Patent
Jeong et al.

(10) Patent No.: US 9,755,182 B2
(45) Date of Patent: Sep. 5, 2017

(54) ORGANIC LIGHT EMITTING DIODE DISPLAY

(71) Applicant: Samsung Display Co., Ltd., Yongin-si, Gyeonggi-Do (KR)

(72) Inventors: Chang Yong Jeong, Yongin-si (KR); Mu Gyeom Kim, Hwaseong-si (KR); Yong Il Kim, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/881,992

(22) Filed: Oct. 13, 2015

(65) Prior Publication Data
US 2016/0254479 A1 Sep. 1, 2016

(30) Foreign Application Priority Data
Feb. 26, 2015 (KR) .......................... 10-2015-0027324

(51) Int. Cl.
*H01L 51/52* (2006.01)

(52) U.S. Cl.
CPC ...... *H01L 51/5246* (2013.01); *H01L 51/5237* (2013.01); *H01L 51/5256* (2013.01)

(58) Field of Classification Search
None
See application file for complete search history.

(56) References Cited

U.S. PATENT DOCUMENTS

| | | | | |
|---|---|---|---|---|
| 5,233,451 A | * | 8/1993 | Iguchi | H01R 12/57 349/152 |
| 5,442,470 A | * | 8/1995 | Hashimoto | G02F 1/133308 349/149 |
| 6,025,901 A | * | 2/2000 | Adachi | G02F 1/13452 349/151 |
| 6,686,063 B2 | | 2/2004 | Kobayashi | |
| 7,662,011 B2 | * | 2/2010 | Yamazaki | H01L 27/3246 427/66 |
| 9,276,055 B1 | * | 3/2016 | Son | H01L 27/3276 |
| 2002/0068191 A1 | * | 6/2002 | Kobayashi | H01L 51/524 428/690 |
| 2008/0297041 A1 | * | 12/2008 | Park | H05B 33/04 313/504 |
| 2009/0201438 A1 | * | 8/2009 | Kim | H01L 27/3276 349/58 |
| 2010/0320909 A1 | * | 12/2010 | Izumi | H01L 27/3246 315/51 |
| 2011/0019351 A1 | * | 1/2011 | Bayne | G02F 1/133308 361/679.01 |

(Continued)

FOREIGN PATENT DOCUMENTS

KR 10-2008-0061528 A 7/2008

*Primary Examiner* — Joseph Schoenholtz
(74) *Attorney, Agent, or Firm* — Robert E. Bushnell, Esq.

(57) ABSTRACT

Provided is an organic light emitting diode display including a substrate; a display unit formed on the substrate and including a thin film transistor and an organic light emitting diode; a thin film encapsulation covering and encapsulating the display unit and formed by a laminated structure made of at least one first inorganic layer, a first organic layer, and a second inorganic layer; and a protective bezel fixed to the substrate and spaced apart from the side of the substrate to surround edges of the substrate and the thin film encapsulation.

10 Claims, 8 Drawing Sheets

(56) References Cited

U.S. PATENT DOCUMENTS

2014/0300270 A1* 10/2014 Sakamoto .............. H05B 33/10
          315/51
2016/0095172 A1* 3/2016 Lee ....................... C23C 16/401
          313/504
2016/0126498 A1* 5/2016 Kim ................... H01L 51/5259
          257/40
2016/0306472 A1* 10/2016 Park ..................... G06F 3/0412

* cited by examiner

ORGANIC LIGHT EMITTING DIODE DISPLAY

CLAIM OF PRIORITY

This application claims the priority to and all the benefits accruing under 35 U.S.C. §119 of Korean Patent Application No. 10-2015-0027324 filed in the Korean Intellectual Property Office (KIPO) on Feb. 26, 2015, the entire contents of which are incorporated herein by reference.

BACKGROUND OF THE INVENTION

1. Field of Disclosure

The described technology relates generally to an organic light emitting diode display, and more particularly, to an organic light emitting diode display including a thin film encapsulation.

2. Description of the Related Art

An organic light emitting diode display includes an organic light emitting diode including an anode (a hole injection electrode), an organic emission layer, and a cathode (an electron injection electrode). An electron and a hole are coupled with each other in the organic emission layer to generate an exciton, and light is emitted by energy generated when the exciton falls from an excited state to a ground state.

The organic light emitting diode easily deteriorates by external moisture, oxygen, or the like, a structure that encapsulates the organic light emitting diode from the outside is required. A thin film encapsulation is an encapsulation structure which is mainly applied to a flexible organic light emitting diode display and configured by a structure in which at least one inorganic layer and at least one organic layer are laminated.

However, an encapsulation effect of the thin film encapsulation may slightly deteriorate in a non-display area outside a display area. For example, in the organic light emitting diode display, a gap between a substrate and the thin film encapsulation is generated at an edge through many manufacturing processes after forming the thin film encapsulation, or the edge of the thin film encapsulation may be partially torn out.

In this case, since moisture and oxygen permeate toward the display area along an interface between the inorganic layer and the organic layer from the edge of the thin film encapsulation, the organic light emitting diode positioned at the edge of the display area may easily deteriorate. Furthermore, recently, since development is ongoing in a direction of reducing a width of the non-display area, the above situations of gap generation could more easily allow gas and moisture to permeate into the display area and deteriorate the organic light emitting diode and methods for improving weakness of the thin film encapsulation have been required.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode display capable of suppressing deterioration of an organic light emitting diode by improving weakness of a thin film encapsulation for a non-display area in the organic light emitting diode display including the thin film encapsulation.

An exemplary embodiment provides an organic light emitting diode display including a substrate, a display unit, a thin film encapsulation, and a protective bezel. The display unit is formed on the substrate and includes a thin film transistor and an organic light emitting diode. The thin film encapsulation covers and encapsulates the display unit and is formed by a laminated structure made of at least one first inorganic layer, a first organic layer, and a second inorganic layer. The protective bezel is fixed to the substrate and spaced apart from the side of the substrate to surround edges of the substrate and the thin film encapsulation.

A pad part may be positioned at one side of the substrate, and the protective bezel may surround three sides of the substrate except for the pad part. A protective member may be provided below the substrate. The protective bezel may include a first fixing part contacting a lower edge of the protective member, a second fixing part contacting the edge of the thin film encapsulation, and a buffer part connected to the first fixing part and the second fixing part and spaced apart from the substrate and the side of the protective member.

The protective bezel may have elasticity and be assembled with the edge of the substrate by deformation and then press the substrate and the thin film encapsulation by restoring force.

The buffer part may be formed in at least one shape of a C shape and a square of which one side is opened. The buffer part having the C shape may be spaced apart from the substrate and the corner of the protective member. An air layer may exist in the buffer part. On the other hand, a sealant may be formed in the buffer part.

The protective bezel may include three straight parts corresponding to three side of the substrate and configured in combination of a rigid material and a flexible material.

The three straight parts may include a rigid straight part positioned at an opposite side of the pad part and two flexible straight parts connected to both ends of the rigid straight part. On the other hand, the three straight parts may include a flexible straight part positioned at an opposite side of the pad part and two rigid straight parts connected to both ends of the flexible straight part.

The side of the substrate is not exposed outside in a manufacturing process after thin film encapsulation by the protective bezel. Therefore, it is possible to prevent a gap between the substrate and the thin film encapsulation from being generated or the thin film encapsulation from being partially removed in spite of external impact applied to the substrate and efficiently suppress deterioration of the organic light emitting diode according to a defect of the thin film encapsulation.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
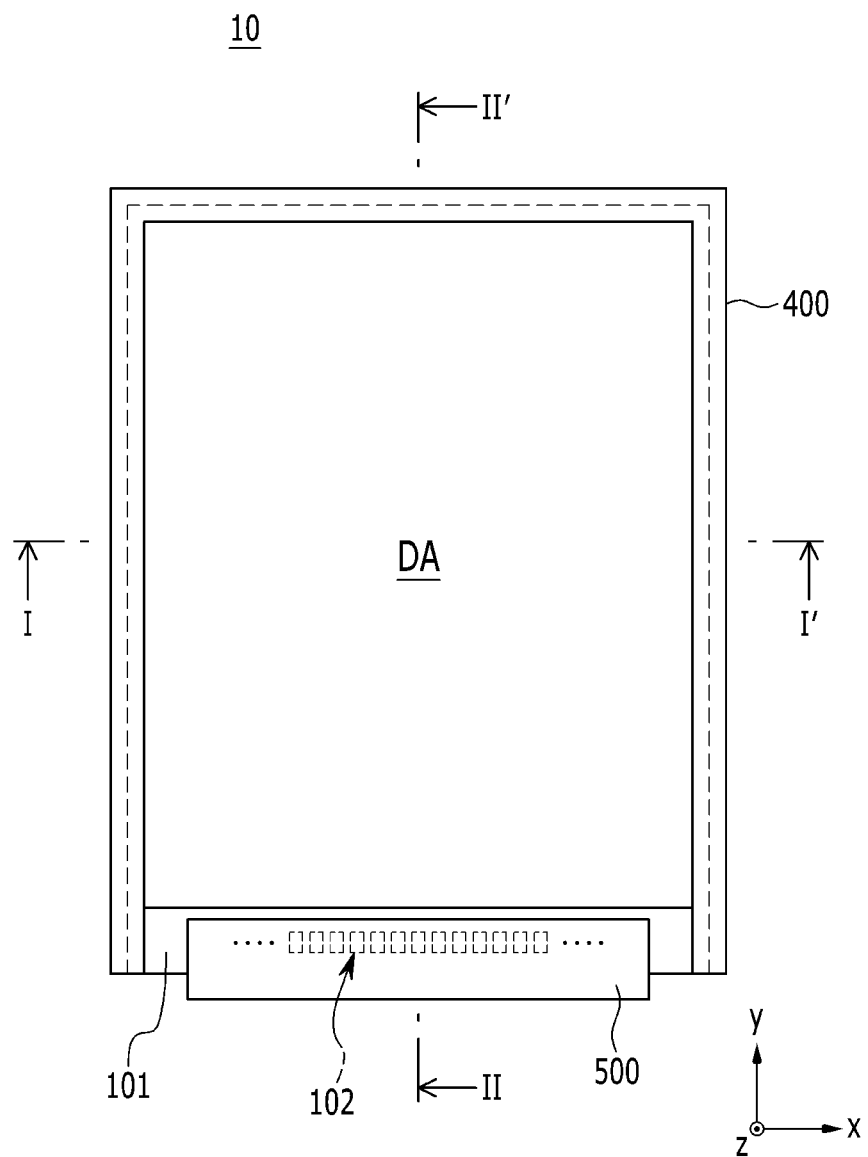
FIG. 1 is a schematic plan view of an organic light emitting diode display according to a first exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In addition, unless explicitly described to the contrary, the word "comprise" and variations such as "comprises" or "comprising", will be understood to imply the inclusion of stated elements but not the exclusion of any other elements. In addition, the size and thickness of each configuration shown in the drawings are arbitrarily shown for understanding and ease of description, but the present disclosure is not limited thereto.

Figure 2:
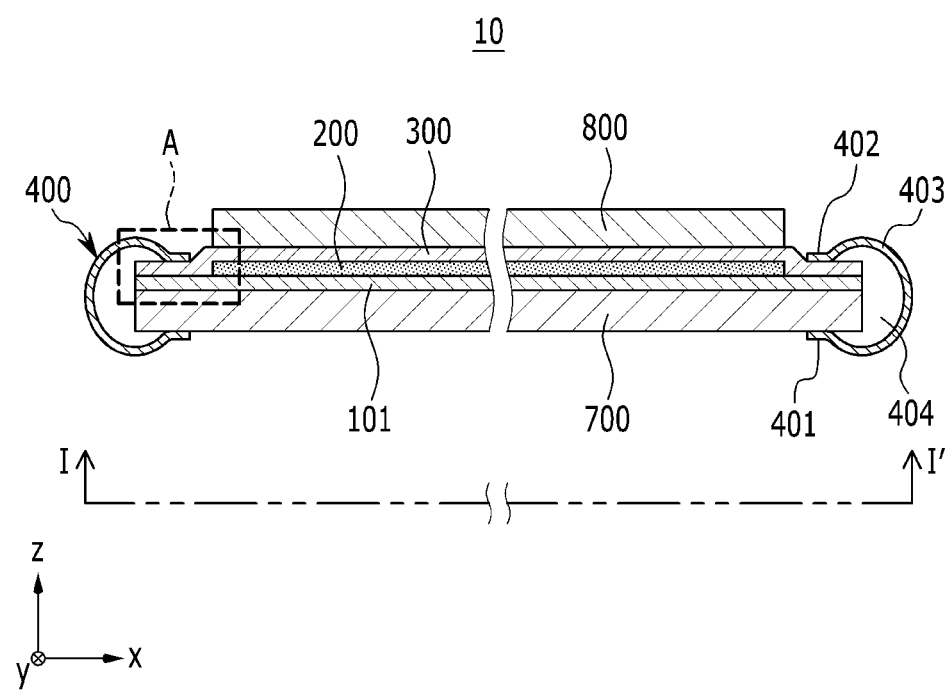
FIG. 2 is a cross-sectional view of the organic light emitting diode display of FIG. 1 taken along line I-I'.
Figure 3:
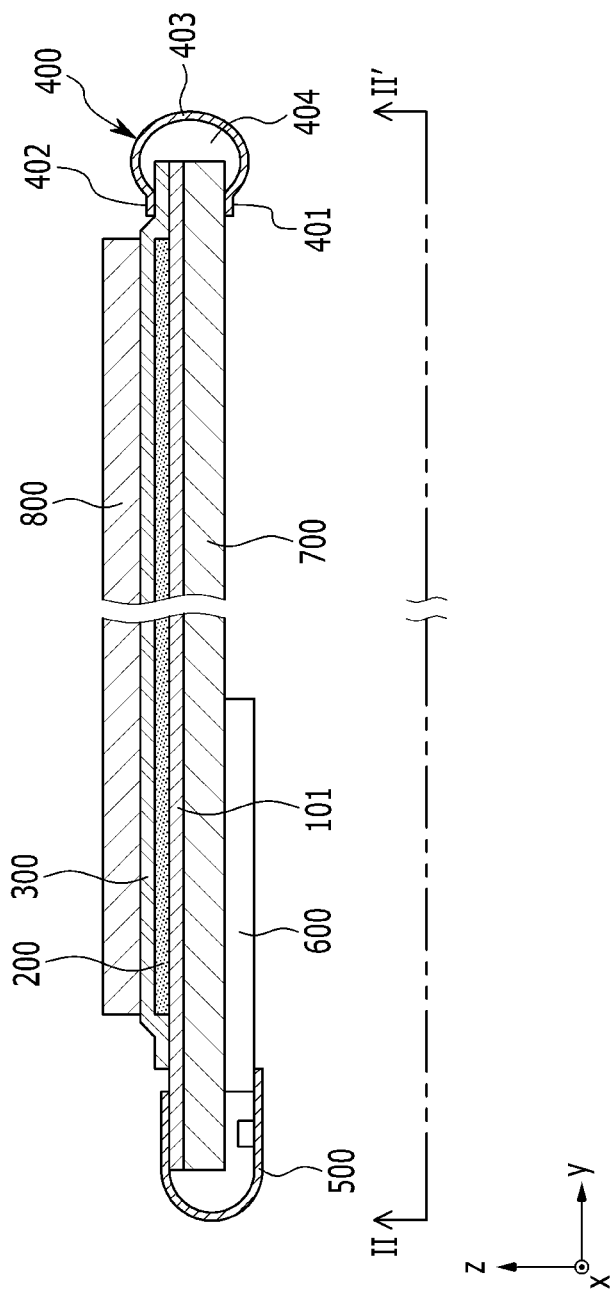
FIG. 3 is a cross-sectional view of the organic light emitting diode display of FIG. 1 taken along line II-II'.

FIG. 1 is a schematic plan view of an organic light emitting diode display according to a first exemplary embodiment, FIG. 2 is a cross-sectional view of the organic light emitting diode display of FIG. 1 taken along line I-I', and FIG. 3 is a cross-sectional view of the organic light emitting diode display of FIG. 1 taken along line II-II'.

Referring to FIGS. 1 to 3, an organic light emitting diode display 10 of the first exemplary embodiment includes a substrate 101, a display unit 200 and a thin film encapsulation 300 formed on the substrate 101, and a protective bezel 400 surrounding and encapsulating edges of the substrate 101 and the thin film encapsulation 300.

The substrate 101 may be a flexible substrate and made of a plastic film with excellent heat resistance and durability such as polyimide, polyethylene terephthalate, polycarbonate, polyethylene naphthalate, polyarylate, and polyether imide. On the other hand, the substrate 101 may be made of a rigid material such as glass or metal.

The display unit 200 defines a display area DA on the substrate 101 and includes a plurality of thin film transistors and a plurality of organic light emitting diodes. The display unit 200 includes a plurality of pixels, and each pixel includes a plurality of subpixels. For each subpixel, at least two thin film transistors (a switching thin film transistor and a driving thin film transistor), at least one capacitor, and one organic light emitting diode are provided.

The outside of the display area DA is a non-display area, and a pad part 102 is positioned at one side of the substrate 101. One side of a chip on film (COF) 500 is attached to the pad part 102, and an opposite side of the COF 500 is attached to a printed circuit board (PCB) 600. The COF 500 is curved and thus the PCB 600 overlaps with the substrate 101 at the rear side of the substrate 101. The PCB 600 transmits a control signal to the display unit 200 through the COF 500. The COF 500 may be replaced with a flexible printed circuit (FPC).

Figure 4:
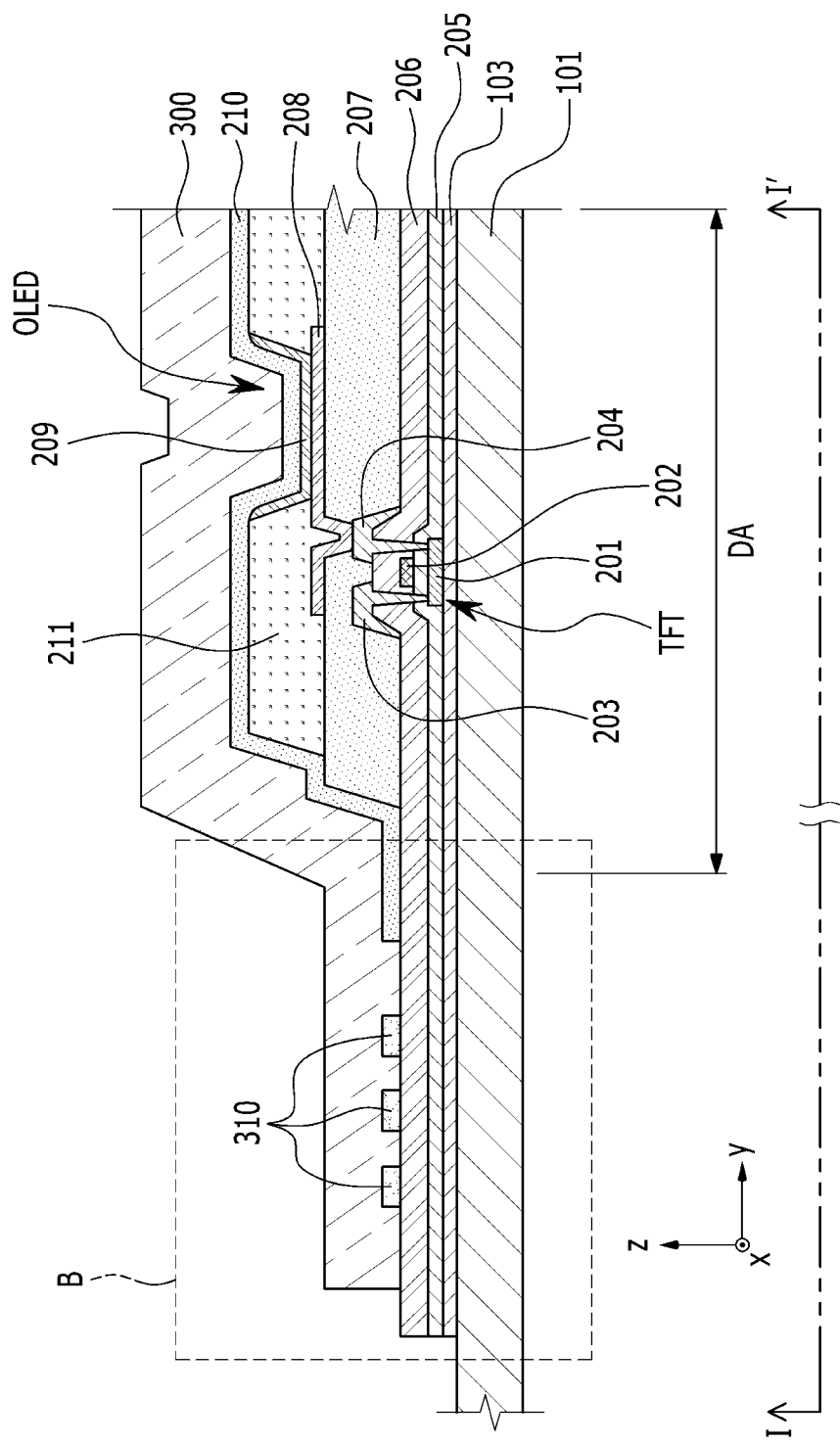
FIG. 4 is a partial enlarged diagram of part A of FIG. 2.
Figure 5:
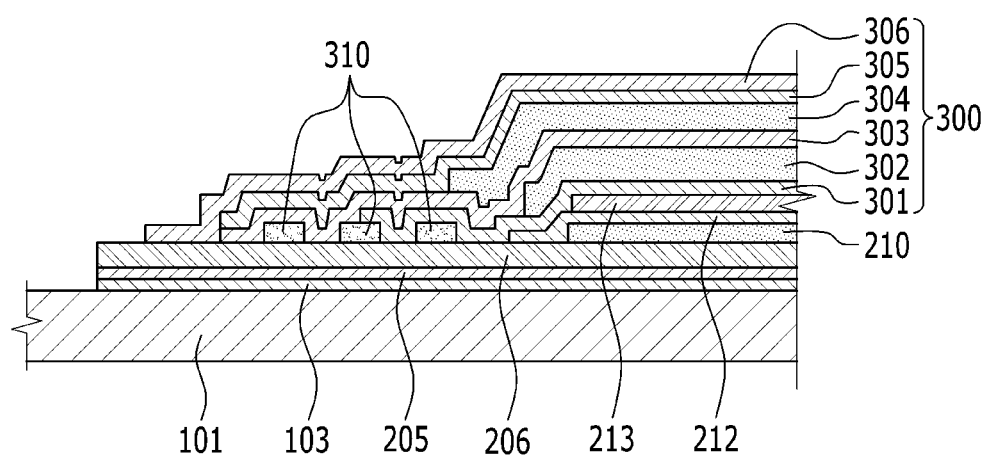
FIG. 5 is a partial enlarged diagram of part B of FIG. 4.

FIG. 4 is a partial enlarged diagram of part A of FIG. 2, and FIG. 5 is a partial enlarged diagram of part B of FIG. 4.

Referring to FIGS. 4 and 5, a buffer layer 103 is formed on the substrate 101. The buffer layer 103 is formed in both the display area DA and the non-display area outside the display area DA. The buffer layer 103 serves to prevent an impurity element from permeating through the substrate 101 and provide a flat surface to the top of the substrate 101. The buffer layer 103 may include an inorganic material such as $SiO_2$ and $SiN_x$ or an organic material such as polyimide, polyester, and acryl.

The thin film transistor TFT is formed on the buffer layer 103. The thin film transistor TFT includes a semiconductor layer 201, a gate electrode 202, a source electrode 203, and a drain electrode 204. The semiconductor layer 201 may be formed by an inorganic semiconductor such as amorphous silicon or polysilicon, an organic semiconductor, or an oxide semiconductor, and includes a source region, a drain region, and a channel region. In FIG. 4, one driving thin film transistor is illustrated.

A gate insulating layer 205 is formed on the semiconductor layer 201. The gate insulating layer 205 is formed in both the display area DA and the non-display area. The gate insulating layer 205 is to insulate the semiconductor layer 201 and the gate electrode 202 from each other and may include an inorganic material such as $SiO_2$ and $SiN_x$ or an organic material. The gate electrode 202 is formed on the gate insulating layer 205. The gate electrode 202 overlaps with the channel region of the semiconductor layer 201 and may include Au, Ag, Cu, Ni, Pt, Pd, Al, Mo, and the like.

An interlayer insulating layer 206 is formed on the gate electrode 202. The interlayer insulating layer 206 is also formed in both the display area DA and the non-display area. The interlayer insulating layers 206 are disposed between the gate electrode 202 and the source electrode 203 and between the gate electrode 202 and the drain electrode 204 to insulate them from each other. The interlayer insulating layer 206 includes an inorganic material such as $SiO_2$ and $SiN_x$ and may have a double-layer structure of a $SiO_2$ layer and a SiNx layer.

The source electrode 203 and the drain electrode 204 are formed on the interlayer insulating layer 206. In this case, via holes are formed in the interlayer insulating layer 206 and the gate insulating layer 205 to expose the source region and the drain region of the semiconductor layer 201, and through the via holes, the source electrode 203 contacts the source region and the drain electrode 204 contacts the drain region. The source electrode 203 and the drain electrode 204 may be formed by a metal multilayer such as Mo/Al/Mo or Ti/Al/Ti.

In FIG. 4, a top gate type thin film transistor TFT is illustrated as an example, but a structure of the thin film transistor TFT is not limited to the illustrated example. The thin film transistor TFT is covered and protected by a passivation layer 207 and electrically connected to the organic light emitting diode OLED to drive the organic light emitting diode OLED. The passivation layer 207 is formed in display area DA.

The passivation layer 207 is formed of an inorganic insulating layer or an organic insulating layer, or may be formed by a laminated structure made of the inorganic insulating layer and the organic insulating layer. The inorganic insulating layer may include $SiO_2$, $SiN_x$, $Al_2O_3$, $TiO_2$, $Ta_2O_5$, $HfO_2$, $ZrO_2$, or the like, and the organic insulating layer may include polymethylmethacrylate (PMMA), polystyrene (PS), an acryl-based polymer, an imide-based polymer, an arylether-based polymer, or the like.

The organic light emitting diode OLED is formed on the passivation layer 207, and includes a pixel electrode 208, an intermediate layer 209, and a common electrode 210. One pixel electrode 208 is provided for each subpixel and contacts the drain electrode 204 through the via hole formed in the passivation layer 207. The common electrode 210 is formed in the entire display area DA and may be formed slight larger than the display area DA.

In the case where the organic light emitting diode display 10 is a top emission type, the pixel electrode 208 is formed by a reflective film, and the common electrode 210 is formed by a transparent film or a translucent film. The reflective film may include Au, Ag, Mg, Al, Pt, Pd, Ni, Nd, Ir, Cr, or the like. The transparent film may include indium tin oxide (ITO), indium zinc oxide (IZO), zinc oxide (ZnO), indium oxide ($In_2O_3$), or the like. The translucent film may be formed by a metal thin film including Li, Ca, LiF/Ca, LiF/Al, Al, Ag, Mg, or the like, and a transparent film such as ITO, IZO, ZnO, or $In_2O_3$ may be formed on the translucent film.

Meanwhile, a pixel defining layer 211 is formed on the pixel electrode 208. The pixel defining layer 211 exposes a predetermined portion of the pixel electrode 208, and the intermediate layer 209 including the organic emission layer is formed on the exposed pixel electrode 208. The organic emission layer may be a low-molecular organic material or a high-molecular organic material, and the intermediate layer 209 may further include at least one of a hole injection layer, a hole transport layer, an electron transport layer, and an electron injection layer, in addition to the organic emission layer.

The light emitted from the organic emission layer is reflected by the pixel electrode 208 and passes through the common electrode 210 to be emitted to the outside. The organic light emitting diode display 10 of the exemplary embodiment is not limited to the top emission type, and may be configured by a bottom emission type or a double-side emission type. In the case of the bottom emission type, the pixel electrode 208 is formed by a transparent film or a translucent film, and the common electrode 210 is formed by a reflective film.

A capping layer 212 is formed on the common electrode 210. The capping layer 212 serves to protect the organic light emitting diode OLED and optimize light efficiency through refractive index matching in the case of the top emission type. The capping layer 212 may include an organic material such as tris(8-hydroxyquinoline) aluminum (Alq3) or copper phthalocyanine (CuPc) and be formed slightly larger than the common electrode 210.

A blocking layer 213 is formed on the capping layer 212. The blocking layer 213 may include an inorganic material such as LiF, MgF2, CaF2, or the like, and prevent the organic light emitting diode OLED from being damaged by plasma used in a process of forming an inorganic film of thin film encapsulation 300. Further, like the capping layer 212, the blocking layer 213 may have a function of optimizing light efficiency by matching a refractive index in the case of the top emission type. The blocking layer 213 may be formed of LiF having a pin hole structure and formed slightly smaller than the capping layer 212.

The thin film encapsulation 300 configured by a laminated structure made of the inorganic layer and the organic layer is formed on the blocking layer 213. In FIG. 4, a case where the thin film encapsulation 300 is configured by a first inorganic layer 301, a first organic layer 302, a second inorganic layer 303, a second organic layer 304, a third inorganic layer 305, and a fourth inorganic layer 306 is illustrated as an example, but the thin film encapsulation 300 is not limited to the illustrated structure.

The first inorganic layer 301 is formed larger than the capping layer 212 and the blocking layer 213 and may include aluminum oxide ($AlO_x$). The first inorganic layer 301 may be formed with a thickness of about 500 Å by a sputtering method using plasma. Since the first inorganic layer 301 is grown along a crystal structure of the blocking layer 213 having a pin hole, minute cracks may evenly exist on the entire first inorganic layer 301.

The first organic layer 302 is formed smaller than the first inorganic layer 301 on the first inorganic layer 301. In the first organic layer 302, an outgassing phenomenon may occur, and discharging gas may permeate toward the organic light emitting diode OLED. If the first inorganic layer 301 is broken by particles and the like and thus cracks are generated, the discharging gas of the first organic layer 302 is concentrated in a predetermined crack to permeate into the common electrode 210 and may oxidize the common electrode 210.

However, in the case where the first inorganic layer 301 entirely includes minute cracks, even though gas is discharged from the first organic layer 302, the gas is not concentrated at any one point but widely dispersed to prevent oxidation of the common electrode 210 at the predetermined point from being caused. The first organic layer 302 may include epoxy, acrylate, urethane acrylate, or the like, and formed with a thickness of approximately 30,000 Å.

The second inorganic layer 303 is formed larger than the first inorganic layer 301 and the first organic layer 302 to cover edges of the first inorganic layer 301 and the first organic layer 302. The second inorganic layer 303 may include $SiN_x$ and formed with a thickness of approximately 10,000 Å by a chemical vapor deposition (CVD) method without using plasma. In this case, even though the particles exist in the first organic layer 302, the second inorganic layer 303 may sufficiently cover a step due to the particles.

The second inorganic layer 303 contacts the interlayer insulating layer 206 in the non-display area. In this case, when the interlayer insulating layer 206 and the second inorganic layer 303 include the same kind of inorganic material, for example, $SiN_x$, external moisture and oxygen may be efficiently suppressed from permeating by increasing adhesion between the interlayer insulating layer 206 and the second inorganic layer 303.

The second organic layer 304 is formed smaller than the second inorganic layer 303 on the second inorganic layer 303. The second organic layer 304 may include epoxy, acrylate, urethane acrylate, or the like, and have a thickness of approximately 10,000 Å. The second organic layer 304 alleviates film stress generated in the second inorganic layer 303, and when particles and the like exist on the second inorganic layer 303, the second organic layer 304 flatly covers the particles.

The third inorganic layer 305 is formed larger than the second organic layer 304 on the second organic layer 304. The third inorganic layer 305 may have the same size as the second inorganic layer 303 and contacts the second inorganic layer 303 in the non-display area. The third inorganic layer 305 may have a thickness of approximately 10,000 Å. When the third inorganic layer 305 includes the same kind of inorganic material as the second inorganic layer 303, external moisture and oxygen may be efficiently suppressed from permeating by increasing adhesion with the second inorganic layer 303.

The fourth inorganic layer 306 may include aluminum oxide ($AlO_x$) and be formed larger than the third inorganic layer 305. The thin film encapsulation 300 with the aforementioned configuration is formed all over the display area DA and the non-display area, prevents external moisture and oxygen from permeating by using the inorganic layer, alleviates the stress of the inorganic layer by using the organic layer, and fills minute cracks, pin holes, and the like of the inorganic layer.

At least one of the plurality of inorganic layers 301, 303, 305, and 306 and the plurality of organic layers 302 and 304 may be omitted, and the thin film encapsulation 300 may further include additional inorganic layer and organic layer in addition to the aforementioned layers. That is, the number of inorganic layers and organic layers configuring the thin film encapsulation 300 is not limited. For example, the thin film encapsulation may be configured by a first inorganic layer including $AlO_x$, a first organic layer formed on the first inorganic layer, and a second inorganic layer formed on the first organic layer and including $SiN_x$.

In all cases, the inorganic layer is formed larger than the organic layer so as not to expose the edge of the organic layer to the outside. Since the organic material configuring the organic layer may become a permeating path transferring external moisture, the organic layer is completely covered by the inorganic layer to enhance an encapsulation effect.

Meanwhile, in the non-display area, at least one damper layer 310 may be formed between the interlayer insulating layer 206 and the inorganic layers 301, 303, 305, and 306 of the thin film encapsulation 300. The damper layers 310 may have a square frame shape surrounding the display unit 200 and a plurality of damper layers 310 may be separated from each other at intervals. Based on the damper layers 310, the organic layers 302 and 304 are positioned inside the damper layers 310, and the inorganic layers 301, 303, 305, and 306 may be formed the same as or larger than the damper layers 310 while contacting the damper layers 310.

The damper layers 310 may be made of an organic material, but since the damper layers 310 are separated from each other, a permeating path toward the display unit 200 is not provided. By the plurality of damper layers 310, in the non-display area by the plurality of damper layers 310, the organic materials (the damper layers) and the inorganic materials (the inorganic layers of the thin film encapsulation) are alternately positioned one by one in a surface direction of the substrate 101, and at the edge of the substrate 101, external moisture and oxygen may be efficiently suppressed from permeating according to the surface direction of the substrate 101.

Referring back to FIGS. 1 to 3, a protective member 700 may be provided below the substrate 101. In addition, a touch screen panel, a polarizer, a phase retardation plate, a window film, and the like may be attached to the display area DA above the thin film encapsulation 300. The protective member 700 may be formed by an organic coating layer, an inorganic coating layer, a plastic film, a stainless steel plate, thin film glass, and the like. In FIGS. 2 and 3, the touch screen panel, the polarizer, the phase retardation plate, the window film, and the like are schematically illustrated as one layer 800 for convenience.

The protective bezel 400 is fixed to the substrate 101 so as to surround three sides of the substrate 101 except for the pad part 102. The protective bezel 400 may include a first fixing part 401 contacting a lower edge of the protective member 700, a second fixing part 402 contacting the edge of the thin film encapsulation 300, and a buffer part 403 surrounding the substrate 101 and the side of the protective member 700 at a predetermined distance from the substrate 101 and the side of the protective member 700. The second fixing part 402 does not cover the display area DA and presses the edge of the thin film encapsulation 300.

The buffer part 403 has an air layer 404 therein and does not directly contact the substrate 101 and the side of the protective member 700 but is spaced apart from the substrate 101 and the side of the protective member 700. Accordingly, even though external impact is applied to the protective bezel 400, the air layer 404 alleviates the impact so as not to directly transfer the impact to the side of the substrate 101.

The buffer part 403 may be rounded with a predetermined curvature, and for example, a cross section of the buffer part 403 may have a C shape. In this case, since corners of the substrate 101 and the protective member 700 are surrounded by the air layer 404 of the buffer part 403, input of the external impact may be efficiently prevented. The cross section of the buffer part 403 is not limited to the illustrated example, and the buffer part 403 may have various shapes such as a square of which one side is opened, a semi-circle, and a semi-oval, and the like.

The protective bezel 400 is installed at the edge of the substrate 101 immediately after the thin film encapsulation 300 is formed on the substrate 101 to cover three side of the substrate 101. Accordingly, when the substrate 101 is subjected to many manufacturing processes after the thin film encapsulation 300, defects such that a gap between the substrate 101 and the thin film encapsulation 300 is generated or a part of the edge of the thin film encapsulation 300 is removed may be prevented. Accordingly, the organic light emitting diode display 10 of the exemplary embodiment may suppress the defect of the thin film encapsulation 300 and deterioration of the organic light emitting diode OLED due to the defect.

The protective bezel 400 may be prepared of metal or engineering plastic and have predetermined elasticity. Accordingly, when in a separate process from the substrate 101, the protective bezel 400 is prepared, the protective bezel 400 is opened so that the first fixing part 401 and the second fixing part 402 are far away from each other, and then the protective bezel 400 is inserted into three sides of the substrate 101 and the protective member 700, the protective bezel 400 may be firmly fixed to the substrate 101 by restoring force.

In this case, an adhesive layer (not illustrated) may be provided between the protective member 700 and the first fixing part 401 and between the thin film encapsulation 300 and the second fixing part 402. The protective bezel 400 is configured by three straight parts corresponding to three sides of the substrate 101, all of the three straight parts are integrally prepared or the three straight parts are separately prepared may be assembled with the three sides of the substrate 101.

Figure 6:
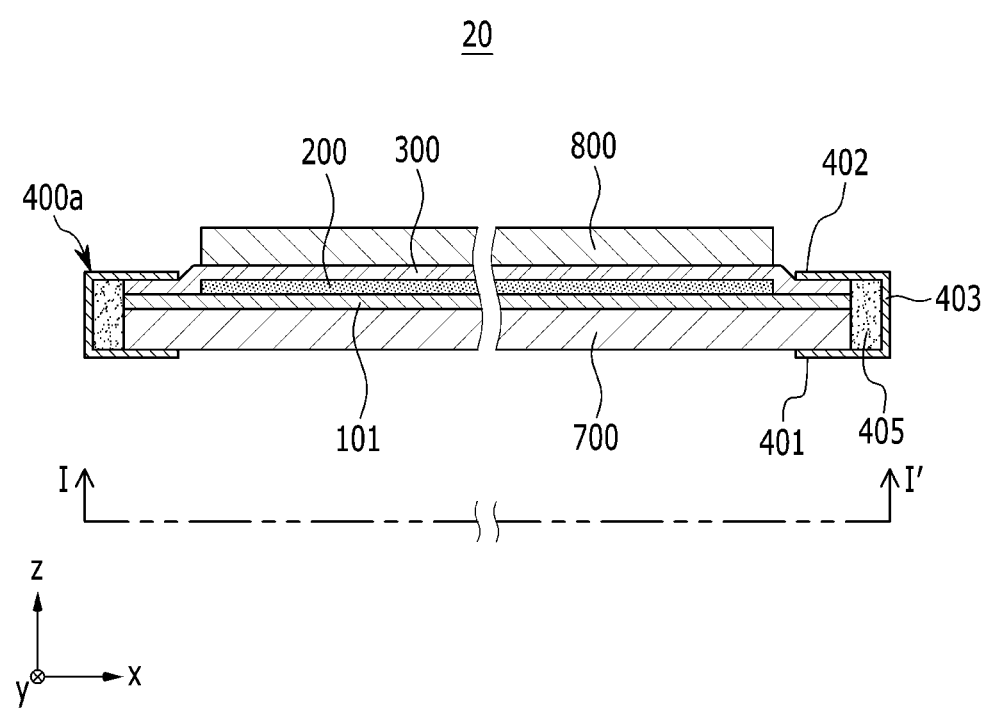
FIG. 6 is a cross-sectional view of an organic light emitting diode display according to a second exemplary embodiment.

FIG. 6 is a cross-sectional view of an organic light emitting diode display according to a second exemplary embodiment.

Referring to FIG. 6, an organic light emitting diode display 20 of the second exemplary embodiment is formed by the same or similar configuration as or to the aforementioned first exemplary embodiment except that a sealant 405 formed inside the buffer part 403 of the protective bezel 400a is further included. The same member as the first exemplary embodiment uses the same reference numeral, and hereinafter, different configurations from the first exemplary embodiment will be mainly described.

In the second exemplary embodiment, unlike the first exemplary embodiment in which the air layer 404 is provided in the buffer part 403, the sealant 405 is provided in the buffer part 403. The sealant 405 contacts the substrate 101, the side of the protective member 700, and the edge of the thin film encapsulation 300 to seal the substrate 101, the side of the protective member 700, and the edge of the thin film encapsulation 300. The sealant 405 efficiently suppresses the damage to the thin film encapsulation 300 and external oxygen and moisture from permeating toward the display unit 200 by reinforcing a sealing function of the protective bezel 400a.

The sealant 405 may be an ultraviolet-curable polymer, and the protective bezel 400a may be installed so as to cover the sealant 405 after curing the sealant 405. In FIG. 6, the buffer part 403 having the square shape of which one side is opened is illustrated as an example, but the cross-sectional shape of the buffer part 403 is not limited to the illustrated example.

Figure 7:
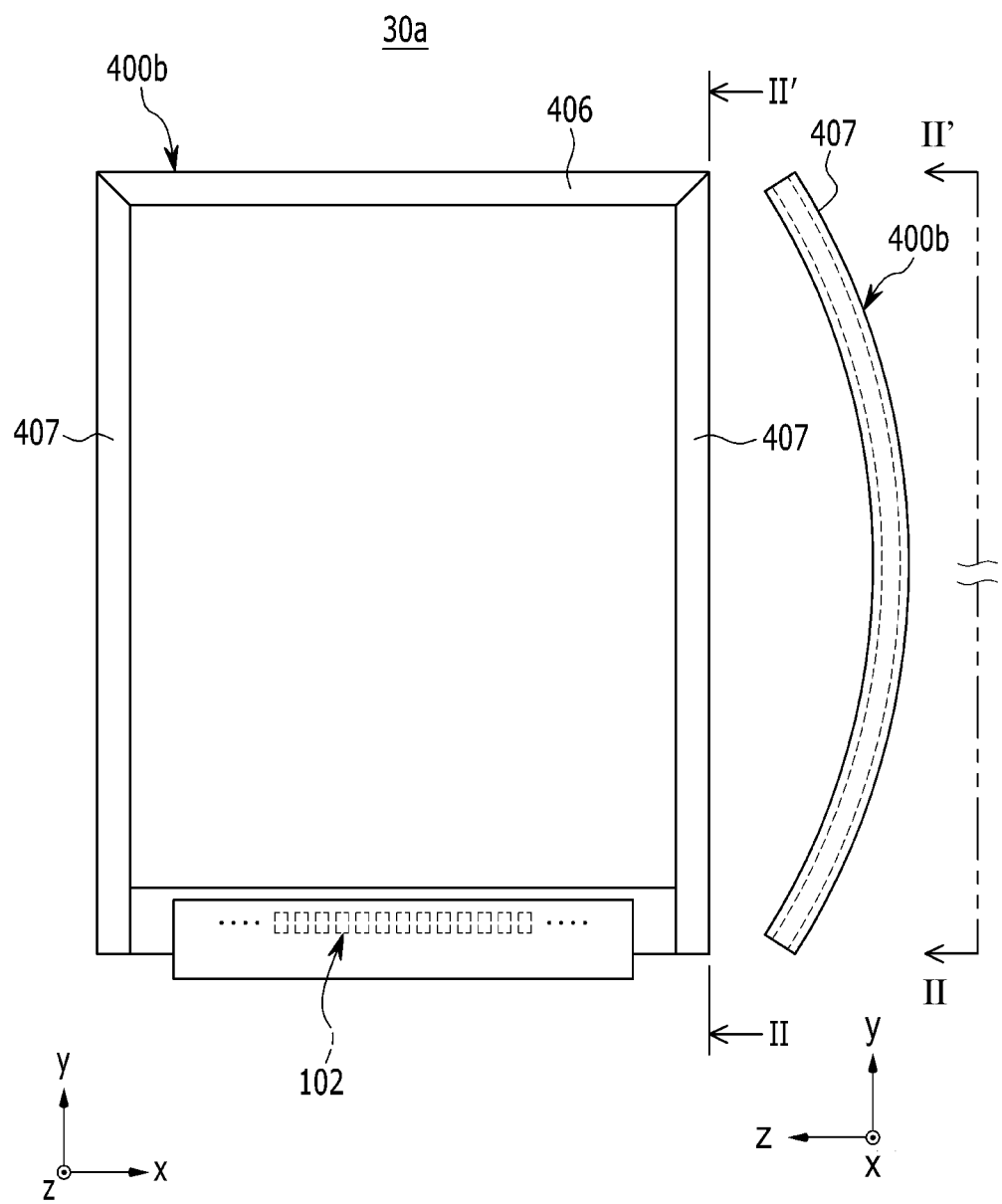
FIGS. 7 and 8 are schematic diagrams of an organic light emitting diode display according to a third exemplary embodiment.
Figure 8:
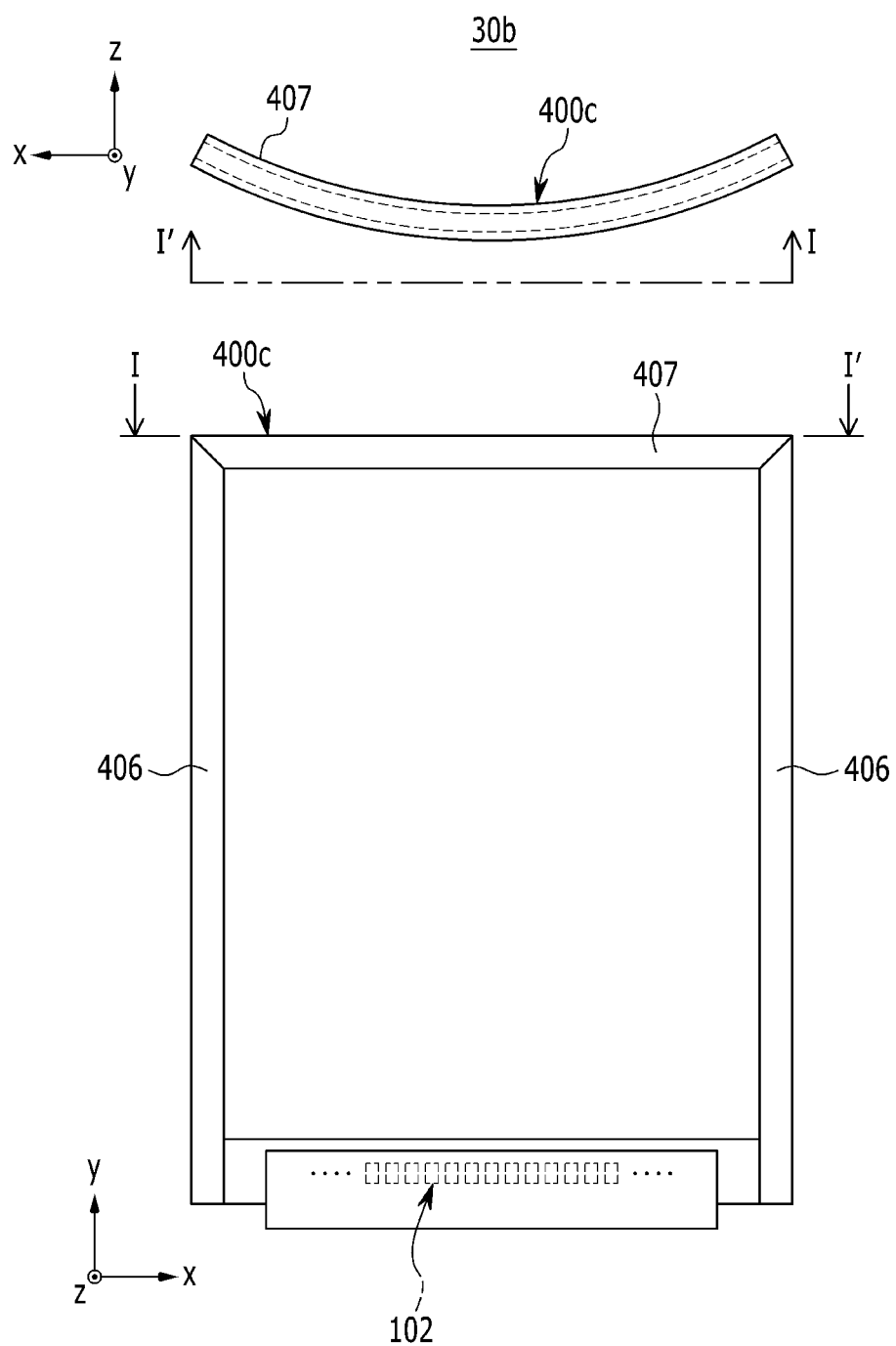

FIGS. 7 and 8 are schematic diagrams of an organic light emitting diode display according to a third exemplary embodiment. In FIGS. 7 and 8, a plan view and a side view of the organic light emitting diode display are illustrated together.

Referring to FIGS. 7 and 8, organic light emitting diode displays 30a and 30b of the third exemplary embodiment are formed by the same or similar configuration as or to the aforementioned first exemplary embodiment except that protective bezels 400b and 400c are formed in combination of a rigid material and a flexible material. The protective bezels 400b and 400c include three straight parts corresponding to three sides of the substrate 101, and three straight parts are configured in combination of a rigid straight part and a flexible straight part.

Referring to FIG. 7, the protective bezel 400b includes one rigid straight part 406 and two flexible straight parts 407. The rigid straight part 406 is positioned on an opposite side of the pad part 102 of the substrate 101, and two flexible straight parts 407 are connected to both ends of the rigid straight part 406. The organic light emitting diode display 30a including the protective bezel 400b may be easily curved in a length direction (a y-axial direction of FIG. 7) of the flexible straight parts 407.

Referring to FIG. 8, the protective bezel 400c includes one flexible straight part 407 and two rigid straight parts 406. The flexible straight part 407 is positioned on an opposite side of the pad part 102 of the substrate 101, and two rigid straight parts 406 are connected to both ends of the flexible straight part 407. The organic light emitting diode display 30b including the protective bezel 400c may be easily curved in a length direction (an x-axial direction of FIG. 8) of the flexible straight parts 407.

In FIGS. 7 and 8, the rigid straight parts 406 may be formed of metal and the like, and the flexible straight parts 407 may be formed of a non-metallic material such as plastic and acryl. The protective bezels 400b and 400c of the third exemplary embodiment is suitable for the flexible organic light emitting diode display.

In the aforementioned first to third exemplary embodiments, the side of the substrate 101 is not exposed outside in the manufacturing process after the thin film encapsulation 300 by the protective bezels 400, 400a, 400b, and 400c. Accordingly, it is possible to prevent the gap between the substrate 101 and the thin film encapsulation 300 from being generating or the thin film encapsulation 300 from being partially removed even by the external impact applied to the substrate 101, and efficiently suppress deterioration of the organic light emitting diode OLED due to the defect of the thin film encapsulation 300.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
a substrate;
a display unit formed on the substrate and including a thin film transistor and an organic light emitting diode;
a thin film encapsulation covering and encapsulating the display unit and formed by a laminated structure made of at least one first inorganic layer, a first organic layer, and a second inorganic layer;
a protective bezel fixed to the substrate by restoring force, spaced apart from sides of the substrate, and covering edges of the substrate and the thin film encapsulation; and
a protective member is provided below the substrate, and the protective bezel includes:
a first fixing part contacting a lower edge of the protective member;
a second fixing part contacting the edge of the thin film encapsulation; and
a buffer part connected to the first fixing part and the second fixing part and spaced apart from the substrate and a side of the protective member.

2. The organic light emitting diode display of claim 1, wherein:
a pad part is positioned at one of the sides of the substrate, and
the protective bezel surrounds the other three sides of the substrate except for the one side having the pad part.

3. The organic light emitting diode display of claim 2, wherein the protective bezel has elasticity and is assembled with the edge of the substrate by deformation and then presses the substrate and the thin film encapsulation by restoring force.

4. The organic light emitting diode display of claim 2, wherein the buffer part is formed in at least one shape of a C shape and a square, and one side of the buffer part is opened.

5. The organic light emitting diode display of claim 4, wherein the buffer part having the C shape is spaced apart from the substrate and the corner of the protective member.

6. The organic light emitting diode display of claim 4, wherein an air layer exists in the buffer part.

7. The organic light emitting diode display of claim 4, wherein a sealant is formed in the buffer part.

8. The organic light emitting diode display of claim 2, the protective bezel includes three straight parts corresponding to the three sides of the substrate and configured in combination of a rigid material and a flexible material.

9. The organic light emitting diode display of claim 8, wherein the three straight parts includes a rigid straight part positioned at an opposite side of the pad part and two flexible straight parts connected to both ends of the rigid straight part.

10. The organic light emitting diode display of claim 8, wherein the three straight parts includes a flexible straight part positioned at an opposite side of the pad part and two rigid straight parts connected to both ends of the flexible straight part.

* * * * *